United States Patent
Ono et al.

(10) Patent No.: US 7,759,784 B2
(45) Date of Patent: Jul. 20, 2010

(54) 3D CIRCUIT MODULE, MULTILAYER 3D CIRCUIT MODULE FORMED THEREOF, MOBILE TERMINAL DEVICE USING THE CIRCUIT MODULES AND METHOD FOR MANUFACTURING THE CIRCUIT MODULES

(75) Inventors: Masahiro Ono, Osaka (JP); Shigeru Kondou, Osaka (JP); Kazuhiro Nishikawa, Osaka (JP); Kazuto Nishida, Osaka (JP)

(73) Assignee: Panasonic Corporation, Osaka (JP)

( * ) Notice: Subject to any disclaimer, the term of this patent is extended or adjusted under 35 U.S.C. 154(b) by 563 days.

(21) Appl. No.: 11/196,269

(22) Filed: Aug. 4, 2005

(65) Prior Publication Data

US 2006/0038274 A1    Feb. 23, 2006

(30) Foreign Application Priority Data

Aug. 20, 2004    (JP) .............................. 2004-240466

(51) Int. Cl.
*H01L 23/02* (2006.01)
(52) U.S. Cl. .................... 257/688; 257/686; 257/687; 257/689; 257/E23.006; 438/109
(58) Field of Classification Search ......... 257/685–689, 257/724, E23.066; 438/109
See application file for complete search history.

(56) References Cited

U.S. PATENT DOCUMENTS 5,241,456 A * 8/1993 Marcinkiewicz et al. .... 361/792
5,280,192 A * 1/1994 Kryzaniwsky .............. 257/723
5,629,835 A * 5/1997 Mahulikar et al. .......... 361/719
5,639,990 A * 6/1997 Nishihara et al. ........... 174/527
5,710,695 A * 1/1998 Manteghi .................... 361/813

(Continued)

FOREIGN PATENT DOCUMENTS

JP    09-107067    4/1997

(Continued)

OTHER PUBLICATIONS

Gilleo K., Area Array Packaging Processes, 2004, McGraw-Hill, p. 196.*

(Continued)

*Primary Examiner*—Eugene Lee
*Assistant Examiner*—Peniel M Gumedzoe
(74) *Attorney, Agent, or Firm*—McDermott Will & Emery LLP

(57) ABSTRACT

A 3D circuit module which is highly reliable, easily layered and able to mount electronic components in high density is obtained by providing a support member having a frame in the periphery thereof and a recess; a coating layer for coating the frame and filling in the recess, the coating layer being made of resin material which is adhesive and has a softening temperature lower than the softening temperature of the support member; a wiring pattern formed on the coating layer, the wiring pattern including a first land on the frame, a second land on the recess, and a wiring part for connecting between the first land and the second land; and an electronic component having a projecting electrode formed on a side thereof, the electronic component being bonded to the coating layer and accommodated in the recess, with the projecting electrode connected to the second land.

11 Claims, 8 Drawing Sheets

U.S. PATENT DOCUMENTS

| | | | |
|---|---|---|---|
| 6,153,928 A * | 11/2000 | Cho | 257/686 |
| 6,294,839 B1 * | 9/2001 | Mess et al. | 257/777 |
| 6,340,842 B1 * | 1/2002 | Nakamura | 257/724 |
| 6,699,731 B2 * | 3/2004 | Huang et al. | 438/108 |

FOREIGN PATENT DOCUMENTS

| | | |
|---|---|---|
| JP | 2001-250902 | 9/2001 |
| JP | 2002-207986 A | 7/2002 |
| JP | 2002-299553 | 10/2002 |

OTHER PUBLICATIONS

Gilleo K., Area Array Packaging Processes, 2004, McGraw-Hill, p. 99.*

* cited by examiner

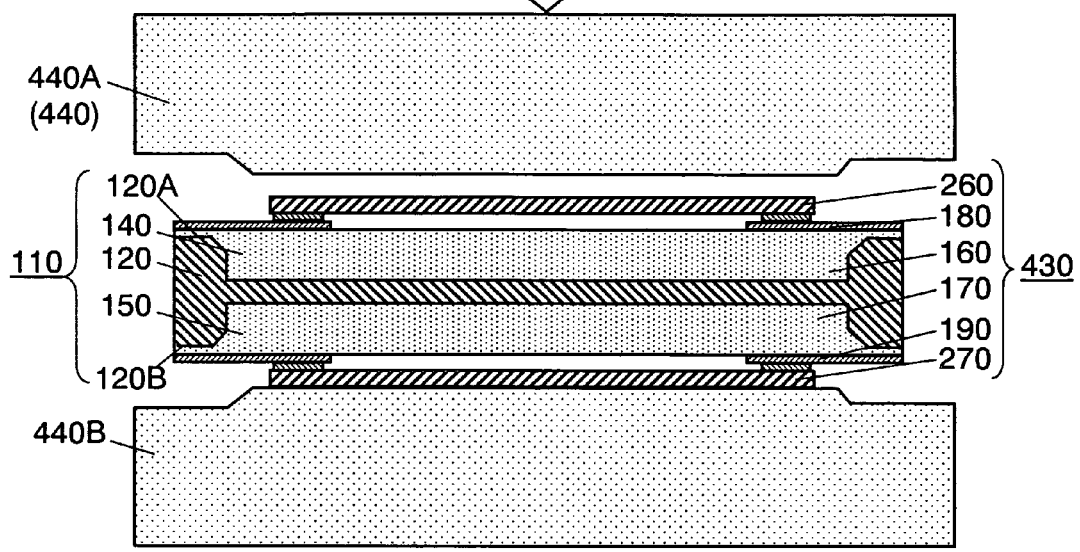
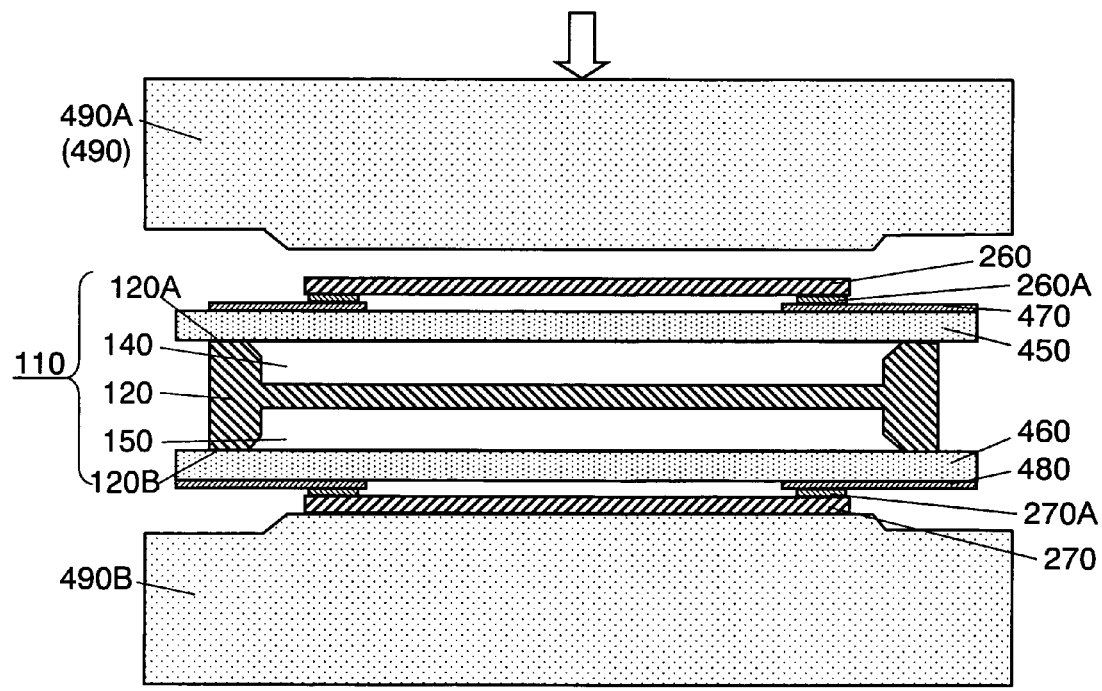

3D CIRCUIT MODULE, MULTILAYER 3D CIRCUIT MODULE FORMED THEREOF, MOBILE TERMINAL DEVICE USING THE CIRCUIT MODULES AND METHOD FOR MANUFACTURING THE CIRCUIT MODULES

BACKGROUND OF THE INVENTION

1. Field of the Invention

The present invention relates to a 3D circuit module such as a memory card which is used as a recording medium for mobile digital devices, and which is suitable as a circuit module to be densely mounted with thin electronic components like a memory IC chip in a predetermined area. The present invention also relates to a multilayer 3D circuit module formed of a plurality of such 3D circuit modules, a mobile terminal device using the 3D or multilayer 3D circuit module, and methods for manufacturing the 3D and multilayer 3D circuit modules.

2. Background Art

A conventional circuit module board used for a memory card is disclosed in Japanese Patent Unexamined Publication No. 2002-207986 (hereinafter, Patent Document 1).

FIGS. 13A and 13B are cross sectional views of a circuit module board disclosed in Patent Document 1.

FIG. 13A shows circuit module board 1030 in which electronic components 1020 such as an IC chip are mounted on only one side of wiring board 1010 made of epoxy resin or the like. FIG. 13B shows circuit module board 1070 in which electronic components 1050 and 1060 are mounted on both sides of wiring board 1040.

As shown in the cross sectional view of FIG. 14, predetermined electrodes 1020A of circuit module board 1030 and predetermined electrodes 1050A and 1060A of circuit module board 1070 are connected with each other by solder 1090 via conductive balls 1080 such as Cu balls.

Circuit module boards 1030 and 1070 thus connected are stacked on base board 1100 so as to form circuit module board 1110 having a 3D circuit structure such as a memory card.

However, in conventional circuit module board 1030 having electronic components 1020 mounted on only one side of wiring board 1010, electronic components 1020 thus mounted may be warped by the difference in linear expansion coefficient between wiring board 1010 and electronic components 1020 or electrodes 1020A. This susceptibility to warpage makes it difficult to reduce circuit module board 1030 in thickness.

On the other hand, in circuit module board 1070 having electronic components 1050 and 1060 mounted on both sides of wiring board 1040, either electronic components 1050 or electronic components 1060 are mounted on one side first and the other are mounted on the other side later. This way of mounting causes a difference in thermal history between mounting electronic components 1050 and mounting electronic components 1060, and results in a difference in adhesive force.

Moreover, the 3D circuit with multilayer structure is formed by connecting between circuit module boards 1030 and 1070 with solder 1090 via conductive balls 1080. Consequently, conductive balls 1080, which are difficult to be supplied at one time to electrodes 1020A, 1050A and 1060A, must be supplied individually, thus decreasing production efficiency.

In addition, these circuit module boards must be arranged with clearance therebetween to avoid contact damage or other damage, making it difficult to reduce the thickness and to increase the density of a 3D circuit with multilayer structure.

SUMMARY OF THE INVENTION

The 3D circuit module of the present invention comprises: a support member having a frame in the periphery thereof and a recess; a coating layer for coating the frame and filling in the recess, the coating layer being made of resin material which is adhesive and has a softening temperature lower than the softening temperature of the support member; a wiring pattern formed on the coating layer, the wiring pattern including a first land on the frame, a second land on the recess, and a wiring part for connecting between the first land and the second land; and an electronic component having a projecting electrode formed on a side thereof, the electronic component being bonded to the coating layer and accommodated in the recess, with the projecting electrode connected to the second land.

A multilayer 3D circuit module of the present invention comprises: a plurality of 3D circuit modules according to the present invention in such a manner that each of the coating layers that coats the frame of the support member of each of the plurality of 3D circuit modules is bonded to an adjacent one of the coating layers that coats the frame of the support member of an adjacent one of the plurality of 3D circuit modules so as to connect each of the first lands with an adjacent one of the first lands of the wiring patterns.

A method for manufacturing a 3D circuit module according to the present invention comprises: forming a support member having a frame in the periphery thereof and a recess; forming a coating layer made of resin material which is adhesive and has a softening temperature lower than the softening temperature of the support member in such a manner as to coat the frame and filling in the recess; forming, on the coating layer, a wiring pattern including a first land on the frame, a second land on the recess, and a wiring part for connecting between the first land and the second land; mounting an electronic component on the coating layer in such a manner that a projecting electrode formed on a side of the electronic component is connected to the second land; and pressing the electronic component mounted on the coating layer into the coating layer in the recess under a temperature of not less than the softening temperature of the resin material and a predetermined pressure.

Another method for manufacturing a 3D circuit module according to the present invention comprises: forming a support member having a frame in the periphery thereof and a recess; forming a wiring pattern, which includes a first land on the frame, a second land on the recess and a wiring part for connecting between the first land and the second land, on a coating sheet coating at least the frame and the recess and made of resin material which is adhesive and has a softening temperature lower than the softening temperature of the support member, and then mounting an electronic component on the coating sheet in such a manner that a projecting electrode formed on a side of the electronic component is connected to the second land; placing the coating sheet mounted with the electronic component onto the support member in such a manner as to position the first land on the frame, and to position the second land and the electronic component in the recess; and pressing the coating sheet and the electronic component together into the recess under a temperature of not less than the softening temperature of the resin material and a predetermined pressure.

A method for manufacturing a multilayer 3D circuit module according to the present invention comprises: layering a plurality of 3D circuit modules according to claim 1 by stacking the frames of the support members of the plurality of 3D circuit modules on top of each other; and connecting each of the first lands with an adjacent one of the first lands of the wiring patterns by bonding each of the coating layers that coats the frame of the support member of each of the plurality of 3D circuit modules to an adjacent one of the coating layers that coats the frame of the support member of an adjacent one of the plurality of 3D circuit modules under a temperature of not less than the softening temperature of the resin material and a predetermined pressure.

BRIEF DESCRIPTION OF THE DRAWINGS

FIG. 8 is a cross sectional view of pressing a 3D circuit module according to the first embodiment of the present invention.

FIG. 9 is a cross sectional view of another example of pressing a 3D circuit module according to the first embodiment of the present invention.

DETAILED DESCRIPTION OF THE INVENTION

Figure 1:
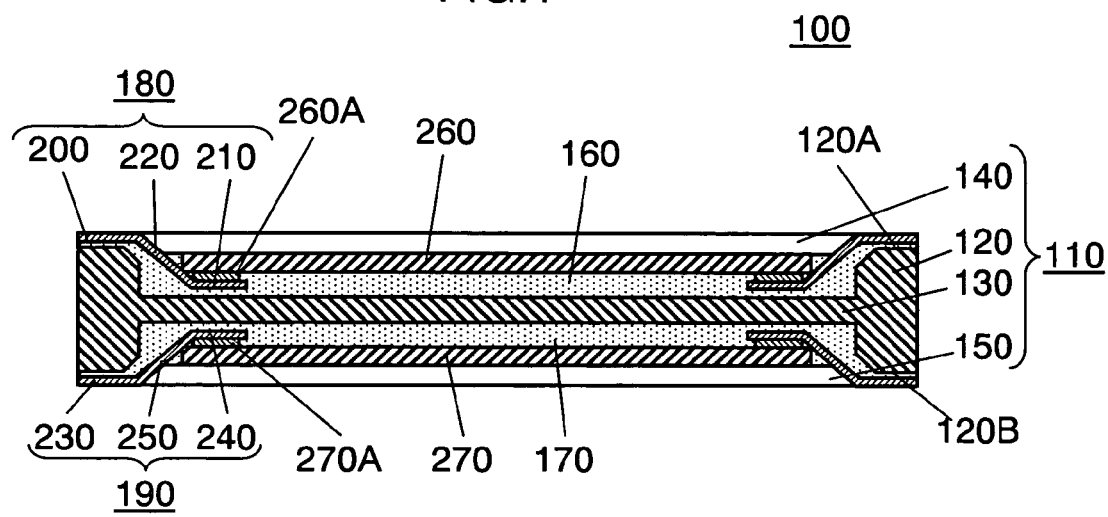
FIG. 1 is a cross sectional view of a 3D circuit module according to a first embodiment of the present invention.

Embodiments of the present invention will be described as follows with reference to accompanying drawings.

Note that some components in the drawings are illustrated in a magnified manner for the sake of clarity.

First Embodiment

Figure 2:
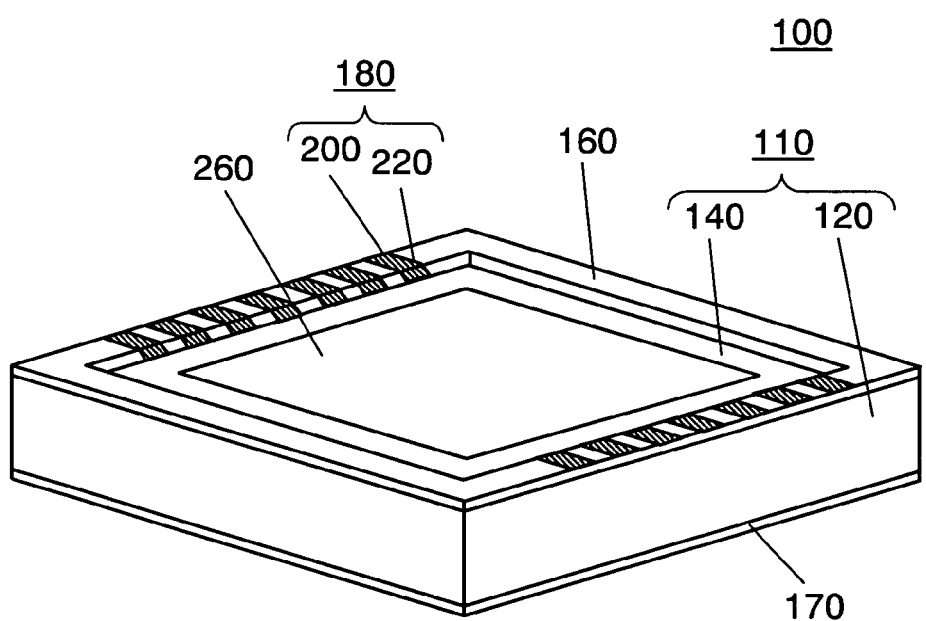
FIG. 2 is an external perspective view of the 3D circuit module according to the first embodiment of the present invention.

FIG. 1 is a cross sectional view of a 3D circuit module according to a first embodiment of the present invention, and FIG. 2 is an external perspective view thereof.

In FIGS. 1 and 2, support member 110 is provided with frame 120 formed in its periphery, recess 140 on a side thereof, recess 150 on the other side thereof in the thickness direction of frame 120, and bottom member 130. Support member 110 is made of thermoplastic resin or thermosetting resin excellent in rigidity, morphological stability and heat resistance, such as liquid crystal polymer, polyphenylene sulfide or polyphthalamide. Note that support member 110 may be made of metallic material if it can be insulated from wiring patterns and the like by providing coating layers which will be described later.

Coating layers 160 and 170 made of resin material are applied in such a manner as to respectively coat top surface 120A and bottom surface 120B of frame 120 that are formed on both sides of support member 110, and also to respectively fill in recesses 140 and 150. Coating layers 160 and 170 have a lower softening temperature than that of support member 110, and are adhesive at least on their surfaces. Coating layers 160 and 170 are respectively applied to the heights of top surface 120A and bottom surface 120B of frame 120, or to a little lower into recesses 140 and 150. The resin material is polyethylene terephthalate, polyethylene naphthalate or the like, but may other materials.

Coating layers 160 and 170 have wiring patterns 180 and 190, which are gold-plated copper foil or the like, formed thereon and partly pressed thereinto.

Wiring pattern 180 formed on coating layer 160 consists of first land 200 in the position of frame 120, second land 210 in the position of recess 140 and wiring part 220 which connects between first land 200 and second land 210. Similarly, wiring pattern 190 formed on coating layer 170 consists of first land 230, second land 240 and wiring part 250.

Second lands 210 and 240 are pressed into recesses 140 and 150 coated with coating layers 160 and 170 as far as the position near bottom member 130. Second lands 210 and 240 are connected with projecting electrodes (hereinafter, electrodes) 260A and 270A of electronic components 260 and 270, respectively. The electronic components include IC chips and semiconductor memories, which are made as thin as about 50 μm to 200 μm by polishing or other methods.

At least the surfaces of electronic components 260 and 270 that are on the electrodes 260A and 270A side are accommodated in recesses 140 and 150 while being stuck or fixed (hereinafter, bonded) to coating layers 160 and 170. In general, however, the side surfaces of electronic components 260 and 270 are also pressed into coating layers 160 and 170 so as to be coated with and bonded to coating layers 160 and 170.

In 3D circuit module 100 according to the first embodiment of the present invention, electronic components 260 and 270 are respectively pressed into and bonded to coating layers 160 and 170 inside recesses 140 and 150 of support member 110 so as to be accommodated therein. This improves the adhesive force between electrodes 260A, 270A of electronic components 260, 270 and second lands 210, 240 of wiring patterns 180, 190, respectively.

Furthermore, frame 120 in the periphery of support member 110 makes it harder for electronic components 260 and 270 to have warpage or other deformation after their mounting, thereby achieving 3D circuit module 100 of thin type.

Since first lands 200 and 230 of wiring patterns 180 and 190 are formed respectively on top surface 120A and bottom surface 120B of support member 110, electronic components 260 and 270 can be pressed into recesses 140 and 150 of support member 110 to enable wiring patterns 180 and 190 to have 3D structure. A plurality of such 3D circuit modules can be connected directly via first lands 200 and 230 so as to obtain a multilayer 3D circuit module which will be described later.

In FIGS. 1 and 2, electronic components 260 and 270 are symmetrically accommodated by being pressed into and bonded to coating layers 160 and 170 in recesses 140 and 150 of support member 110. This allows electronic components 260 and 270 to be mounted at the same time as will be described later, thereby reducing the difference in thermal history during their mounting. As a result, it becomes harder for electronic components 260 and 270 to have warpage or other deformation, thereby improving connection reliability and making 3D circuit module 100 thinner and denser.

Figure 3:
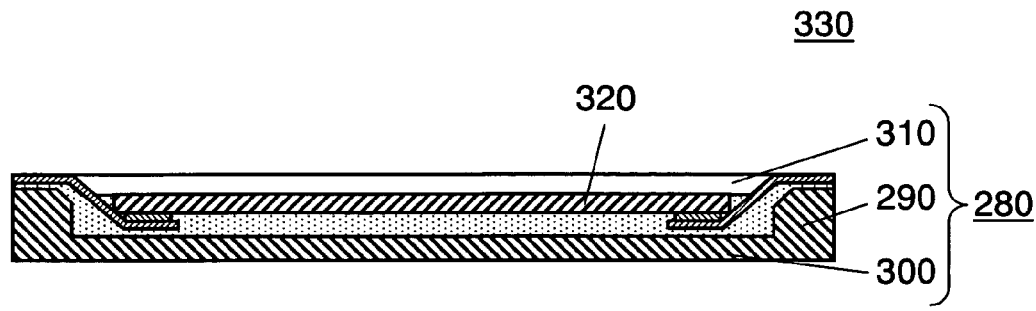
FIG. 3 is a cross sectional view of another example of the 3D circuit module according to the first embodiment of the present invention.

FIG. 3 shows a cross sectional view of 3D circuit module 330, which is another example of the first embodiment. 3D circuit module 330 has recess 310 on only one side of support member 280 with bottom member 300. In this circuit module, frame 290 of support member 280 formed in the periphery of recess 310 makes it difficult for electronic component 320 to have warpage or other deformation after its mounting.

Figure 4:
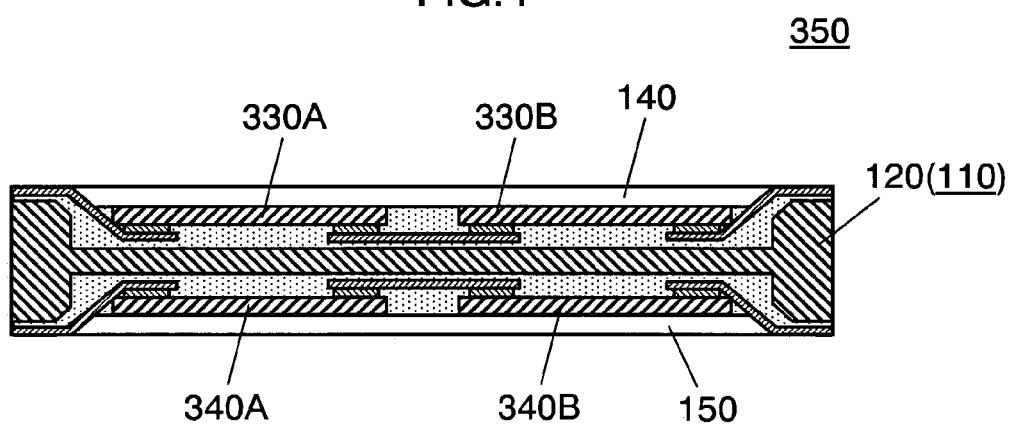
FIG. 4 is a cross sectional view of another example of the 3D circuit module according to the first embodiment of the present invention.

In the first embodiment of the present invention shown in FIG. 1, one electronic component 260 and one electronic component 270 are mounted in recesses 140 and 150, respectively; however, the number of electronic components is not limited to this. For example, as shown in FIG. 4, 3D circuit module 350, which is another example of the first embodiment, has electronic components 330A, 330B and others in recess 140, and electronic components 340A, 340B and others in recess 150 of support member 110. This arrangement can achieve a 3D circuit module with more densely packed electronic components.

Figure 5:
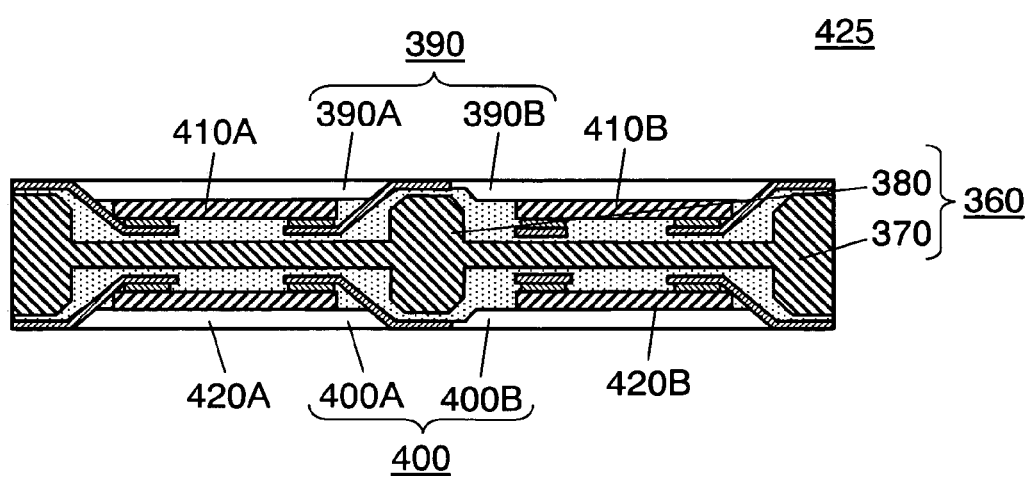
FIG. 5 is a cross sectional view of another example of the 3D circuit module according to the first embodiment of the present invention.

FIG. 5 shows a cross sectional view of 3D circuit module 425, which is another example of the present invention, where the support member has a plurality of recesses on each side thereof. Recess 390 is divided into recesses 390A and 390B, and recess 400 is divided into recesses 400A and 400B by frame 370 and partition frame 380 of support member 360. Then, recesses 390A, 390B and recesses 400A, 400B thus divided accommodate electronic components 410A, 410B and electronic components 420A, 420B, respectively, which are pressed into and bonded to coating layers.

This arrangement makes partition frame 380 of support member 360 improve the mechanical strength, thereby achieving 3D circuit module 425 that is resistant to warpage and other deformation and is highly reliable. The first lands of the wiring patterns can also be formed on partition frame 380.

A method for manufacturing a 3D circuit module according to the first embodiment of the present invention will be described as follows in order of processes.

FIGS. 6A to 6D are cross sectional views depicting the method for manufacturing the 3D circuit module according to the first embodiment of the present invention, and FIGS. 7A to 7D are external perspective views of the 3D circuit module.

Figure 6A:
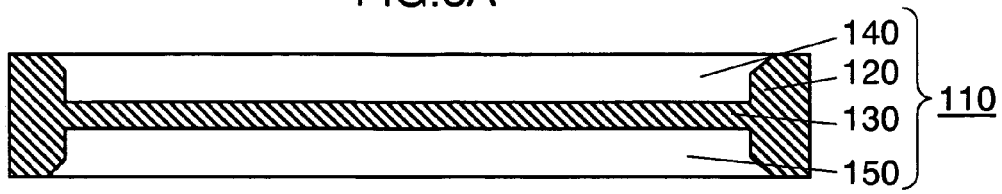
FIGS. 6A, 6B, 6C and 6D are cross sectional views depicting a method for manufacturing a 3D circuit module according to the first embodiment of the present invention.
Figure 6B:
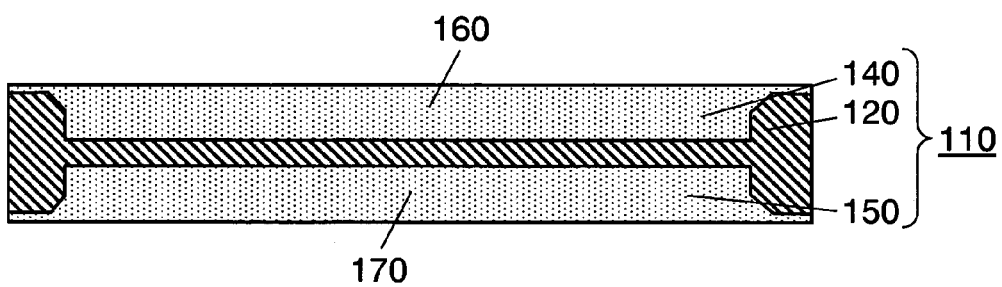
Figure 6C:
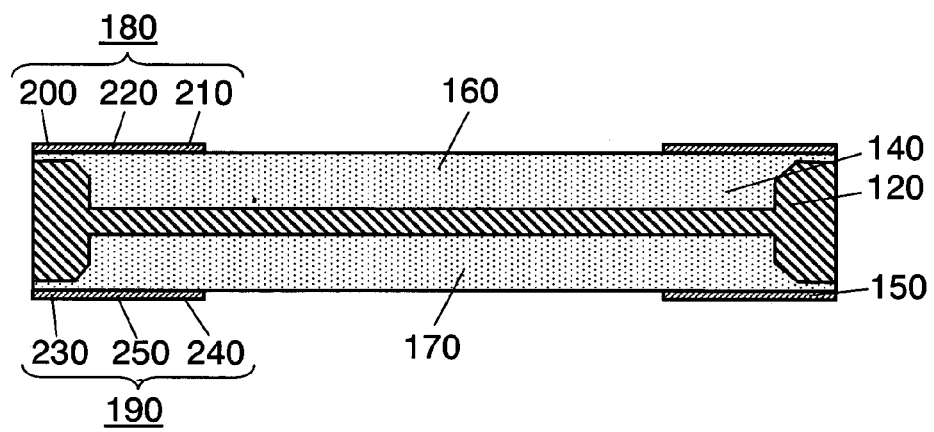
Figure 6D:
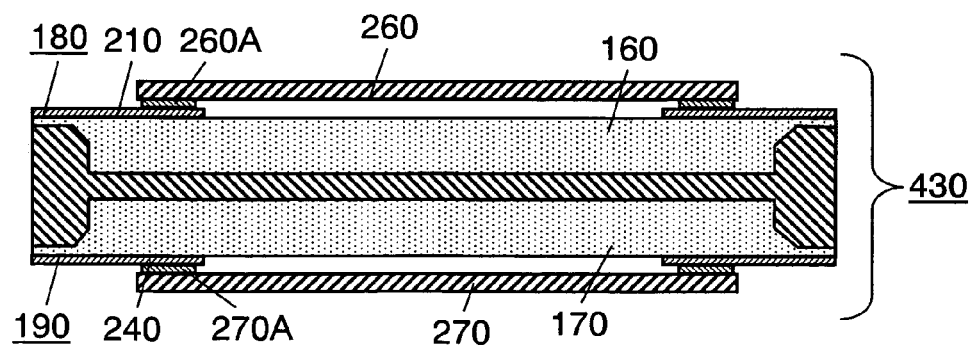
Figure 7A:
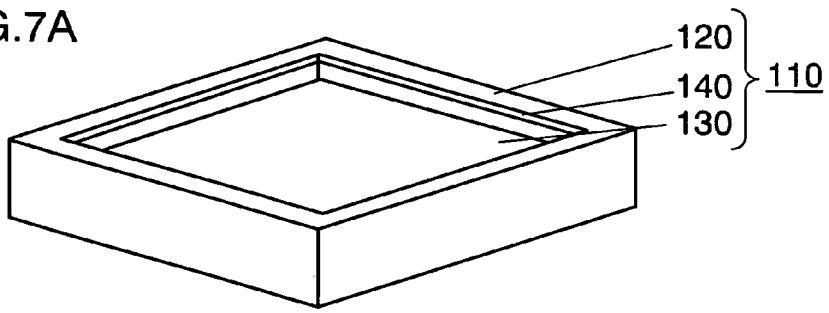
FIGS. 7A, 7B, 7C and 7D are external perspective views depicting the method for manufacturing the 3D circuit module according to the first embodiment of the present invention.

First, as shown in FIGS. 6A and 7A, support member 110 is formed by providing frame 120 in its periphery, bottom member 130, and recesses 140 and 150 on both sides thereof in the thickness direction of frame 120 (corresponding to top surface 120A and bottom surface 120B of frame 120). Support member 110 is made by die forming or cutting work from thermoplastic resin or the like excellent in rigidity, morphological stability and heat resistance, such as liquid crystal polymer, polyphenylene sulfide or polyphthalamide. The recesses have a size large enough for the electronic components which will be described later to be buried. The cross section of the inner surface of the recesses is not limited to that shown in FIGS. 6A to 6D, but can be tapered, vertical or any other shape that does not cause disconnection of the wiring patterns.

Figure 7B:
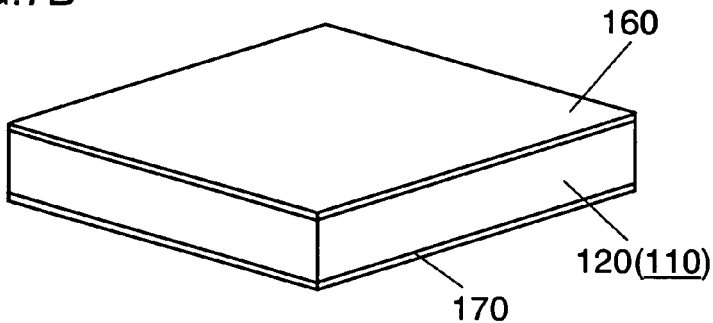

Next, as shown in FIGS. 6B and 7B, coating layers 160 and 170 are applied in such a manner as to respectively coat top surface 120A and bottom surface 120B of frame 120 of support member 110 and also to respectively fill in recesses 140 and 150. Coating layers 160 and 170 are made of resin material which has a lower softening temperature than that of support member 110, and is adhesive at least on its surface. The resin material of the coating layers is polyethylene terephthalate, polyethylene naphthalate or the like, but may be other materials.

In a case where support member 110 is made of liquid crystal polymer, and the resin material of coating layers 160 and 170 is polyethylene terephthalate, coating layers 160 and 170 can be formed at a heating temperature of 250° C. to 300° C., and a pressure of 300 kgf/cm$^2$ to 700 kgf/cm$^2$.

Figure 7C:
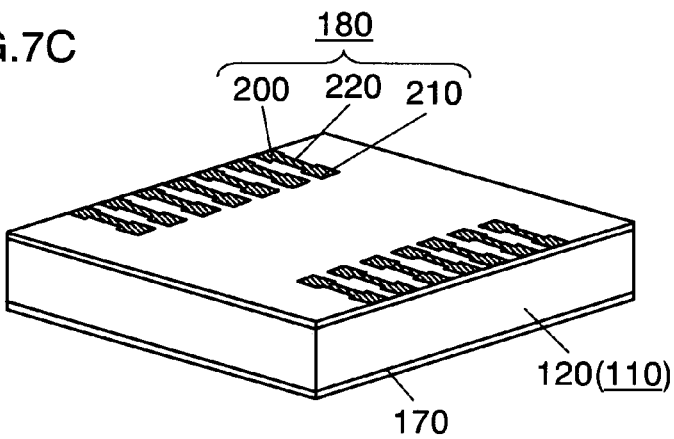

Next, as shown in FIGS. 6C and 7C, copper foil or the like is applied on coating layers 160 and etched. This results in the formation of wiring pattern 180 consisting of first land 200 in the position of top surface 120A of frame 120 of support member 110, second land 210 in a predetermined position on recess 140, and wiring part 220 for connecting between first land 200 and second land 210. As shown in FIG. 6D, wiring pattern 180 is formed in correspondence with the position of electrodes 260A of electronic component 260 to be mounted. Similarly, wiring pattern 190 consisting of first land 230, second land 240 and wiring part 250 is formed on coating layer 170 in correspondence with the position of electrodes 270A of electronic component 270.

In order to improve adhesion, to prevent oxidation and other reasons, the surfaces of wiring patterns are preferably gold-plated after being nickel-plated.

It goes without saying that wiring patterns 180 and 190 can be formed by screen printing, plating or laser processing. In addition to these, other processing can be used as long as wiring patterns 180 and 190 are not disconnected while the electronic components are pressed into the coating layers.

Figure 7D:
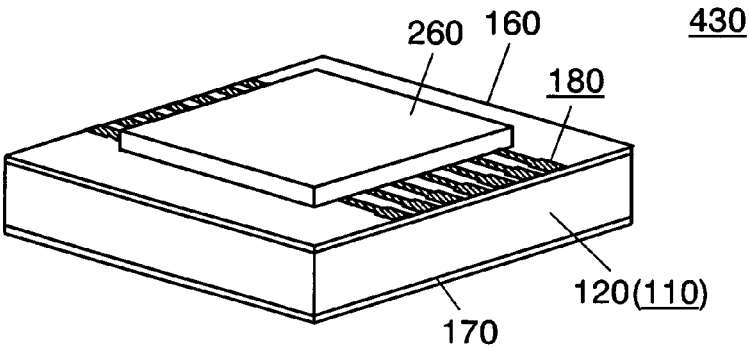

Next, as shown in FIGS. 6D and 7D, electrodes 260A of electronic component 260 are mounted on coating layer 160 while being connected with second land 210 of wiring pattern 180. Similarly, electrodes 270A of electronic component 270 are mounted on coating layer 170 while being connected with second land 240 of wiring pattern 190. This results in the formation of intermediate structure 430.

Coating layers are preferably heated to around the softening temperature during the mounting of the electronic components so as to improve the adhesion of the coating layers, thereby allowing the electronic components to be firmly bonded to the surfaces of the coating layers.

Next, as in a cross sectional view of pressing shown in FIG. 8, intermediate structure 430 is disposed between top mold 440A and bottom mold 440B of press 440.

Intermediate structure 430 mounted with electronic components 260 and 270 is heated at temperatures not less than the softening temperature of coating layers 160 and 170 so as to soften coating layers 160 and 170. In a case where coating layers 160 and 170 are made of polyethylene terephthalate, the heating is done at 80° C. to 200° C.

The top and bottom molds of the press do not necessarily have to have the illustrated protrusions, but can be flat. The shapes of the top and bottom molds can be anything as long as the electronic components can be pressed into the coating layers without causing cracks in themselves or disconnecting the wiring patterns. This holds true also in the subsequent embodiment.

Next, as shown by the arrow of FIG. 8, top mold 440A is lowered in parallel with bottom mold 440B. This operation presses electronic components 260 and 270 into coating layers 160 and 170, respectively, as far as the position of recesses 140,150 that is lower than top surface 120A and bottom surface 120B of support member 110 with a predetermined pressure (e.g. 3 kgf/cm$^2$ to 30 kgf/cm$^2$). The pressure depends on the pin number and size of electronic components.

Finally, intermediate structure 430 is taken out of press 440 and cooled to obtain 3D circuit module 100 shown in FIG. 1. If the coating layers melt and flow to coat the first lands, the surfaces of the first lands may be exposed by polishing or etching.

A press can be pressed from either the top mold or the bottom mold, or from both. In this case, the intermediate structure of 3D circuit module and the press preferably have a mold release sheet or the like disposed therebetween so as to prevent adhesion between them or to achieve uniform pressure distribution.

It is also preferable that the wiring patterns made of copper foil or the like with excellent ductility be formed by etching or transfer by considering the case where the wiring patterns are pulled into the recesses while the press is pressing the electronic components mounted on the intermediate structure into the coating layers inside the recesses of the support member. Furthermore, if possible, the wiring patterns are made larger (corresponding to the pulling) than the external size of the support member.

In a case where the support member is made of material having a high softening temperature, heat is preferably applied at a temperature of not less than the softening temperature of the coating layers. This is because the support member does not soften and deform when the electronic components are pressed, with the intermediate structure disposed between the top mold and the bottom mold of the press. This heating of the support member is also applicable to the subsequent embodiment.

According to the manufacturing method of the first embodiment of the present invention, the formation of the 3D wiring patterns and the mounting of the electronic components are done at the same time to achieve a 3D circuit module. Furthermore, a 3D circuit module with excellent morphological stability and reliability in electrode connection can be manufactured stably and efficiently.

Another method for manufacturing a 3D circuit module according to the first embodiment will be described as follows using FIG. 9 with reference to FIG. 7.

FIG. 9 is a cross sectional view of another example of pressing a 3D circuit module according to the first embodiment of the present invention. In this example, support member 110 is formed in the same manner as the above-described examples of the first embodiment, but is different in having coating sheets 450 and 460 which are flat and have a predetermined thickness. The predetermined thickness indicates a thickness which allows at least the electrode side of the electronic components to be bonded to the coating sheets when the electronic components are pressed into the recesses. The coating sheets are preferably thick enough to bury the electronic components in them; however, their thickness may be about the same as the depth of the recesses. The thickness is not particularly restricted if it is possible to remove deformed parts of the coating sheets that are squeezed out after the electronic components are pressed into the recesses together with the coating sheets.

First of all, a copper foil or the like is bonded onto coating sheet 450. Wiring pattern 470 similar to wiring pattern 180 shown in FIG. 7C is formed by etching in the positions corresponding to top surface 120A of frame 120 of support member 110 and to electrodes 260A of electronic component 260 to be mounted. Similarly, wiring pattern 480 is formed on coating sheet 460 by etching in the positions corresponding to bottom surface 120B of frame 120 of support member 110 and to electrodes 270A of electronic component 270 to be mounted.

Next, heat is applied at a temperature of not less than the softening temperature of the resin material composing coating sheets 450 and 460 which are provided with wiring patterns 470 and 480 respectively. In the same manner as the case shown in FIG. 7D, electrodes 260A of electronic component 260 are mounted on coating sheet 450 while being connected to wiring pattern 470. Similarly, electrodes 270A of electronic component 270 are mounted on coating sheet 460 while being connected to wiring pattern 480.

Next, coating sheets 450 and 460 are bonded to each other by their adhesiveness during the positioning between frame 120 of support member 110 and recesses 140, 150, thereby forming the intermediate structure. At this moment, electronic components 260 and 270 connected to wiring patterns 470 and 480 are mounted in the positions corresponding to recesses 140 and 150, respectively, of support member 110.

Next, between top mold 490A and bottom mold 490B of press 490, coating sheet 450 mounted with electronic component 260 and coating sheet 460 mounted with electronic component 270 are placed on the top and bottom surfaces of the intermediate structure. Coating sheets 450 and 460 are softened by being heated to not less than the softening temperature. When made of polyethylene terephthalate, coating sheets 450 and 460 are heated to 80° C. to 200° C.

Next, as shown by the arrow of FIG. 9, top mold 490A is lowered in parallel with bottom mold 490B. Electronic component 260 and coating sheet 450 are pressed into recess 140, and electric component 270 and coating sheet 460 are pressed into recess 150 of support member 110. As a result, coating sheets 450 and 460 coat frame 120 of support member 110, and also fill in recesses 140 and 150 up to the positions slightly lower than the surfaces of frame 120. After pressing electronic components 260 and 270 into coating sheets 450 and 460, the resulting structure is taken out of press 490 and cooled so as to obtain 3D circuit module 100 shown in FIG. 1. It goes without saying that in this process the 3D circuit module can be taken out of the press after being cooled.

When coating sheets 450 and 460 mounted with electronic components 260 and 270 are pressed into recesses 140 and 150 of support member 110 by press 490, the peripheries of coating sheets 450 and 460 are slightly pulled into recesses 140 and 150. Therefore, coating sheets 450,460 and wiring patterns 470,480 are preferably a little larger than the outer circumference of frame 120 of support member 110. On the other hand, if deformed parts of coating sheets 450 and 460 are squeezed out around support member 110, they should be removed by polishing or the like.

According to the other manufacturing method of the first embodiment of the present invention thus described, the coating sheets are made flat, so that the wiring patterns can be formed on the coating sheets, thereby mounting the electronic components thereon. This facilitates the formation of the wiring patterns and the mounting of the electronic components.

Furthermore, the formation of the 3D wiring patterns and the mounting of the electronic components can be done at the same time, thereby enabling the efficient and stable manufacture of the 3D circuit module.

The first embodiment of the present invention has described the manufacture of 3D circuit modules in which the support member is provided on both sides thereof with recesses containing electronic components; however, the present invention is not limited to this case. The present invention is applicable, e.g. to the manufacture of a 3D circuit module in which only one side of the support member has a recess as shown in FIG. 3.

Second Embodiment

Figure 10:
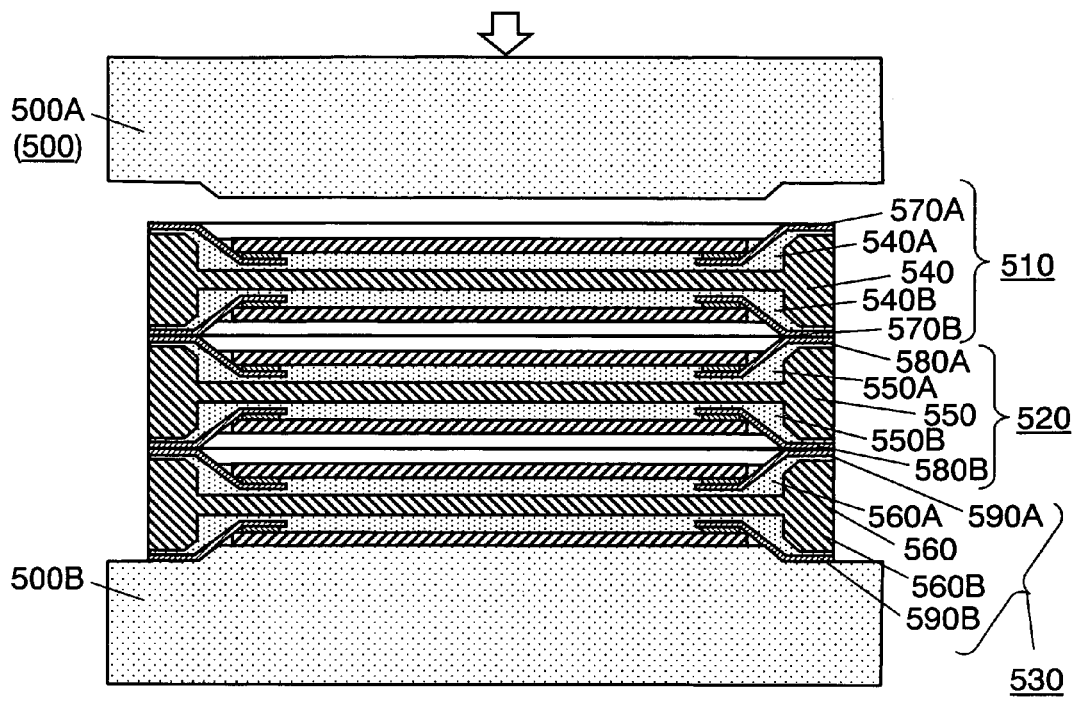
FIG. 10 is a cross sectional view of a multilayer 3D circuit module and a method for manufacturing it according to a second embodiment of the present invention.

FIG. 10 is a cross sectional view of a multilayer 3D circuit module and a method for manufacturing it according to a second embodiment of the present invention.

As shown in FIG. 10, the multilayer 3D circuit module according to the second embodiment of the present invention is obtained by layering a plurality of 3D circuit modules shown in FIG. 1, and by heating/pressing the layered modules with press 500 shown in FIGS. 8 and 9.

A method for manufacturing a multilayer 3D circuit module consisting of three 3D circuit modules 510, 520 and 530 will be described as follows with reference to FIG. 10.

3D circuit modules 510, 520 and 530 have respective support members provided with frames 540, 550 and 560 respectively coated with coating layers 540A, 540B; coating layers 550A, 550B; and coating layers 560A, 560B which are made of resin material. Coating layers 540A, 540B; coating layers 550A, 550B; and coating layers 560A, 560B respectively have first lands 570A, 570B; first lands 580A, 580B; and first lands 590A, 590B of the respective wiring patterns made of copper foil or the like. These 3D circuit modules have the same structure as 3D circuit module 100 shown in the first embodiment. The support members and the coating layers are made of the same resin material mentioned in the first embodiment.

First of all, as shown in FIG. 10, 3D circuit modules 530, 520 and 510 are layered in this order and placed on bottom mold 500B of press 500. Coating layer 540B and first land 570B formed on frame 540 of 3D circuit module 510 respectively come into contact with coating layer 550A and first land 580A formed on frame 550 of 3D circuit module 520 adjacent to 3D circuit module 510. Furthermore, coating layer 550B and first land 580B formed on frame 550 of 3D circuit module 520 are placed in such a manner as to respectively come into contact with coating layer 560A and first land 590A formed on frame 560 of 3D circuit module 530 adjacent to 3D circuit module 520.

In this condition, the coating layers of 3D circuit modules 510, 520 and 530 are heated to not less than the softening temperature of the resin material composing these coating layers. This heating softens coating layers 540A, 540B on frame 540; coating layers 550A, 550B on frame 550; and coating layers 560A, 560B on frame 560, thereby improving the adhesiveness of the surfaces of these coating layers.

Figure 11:
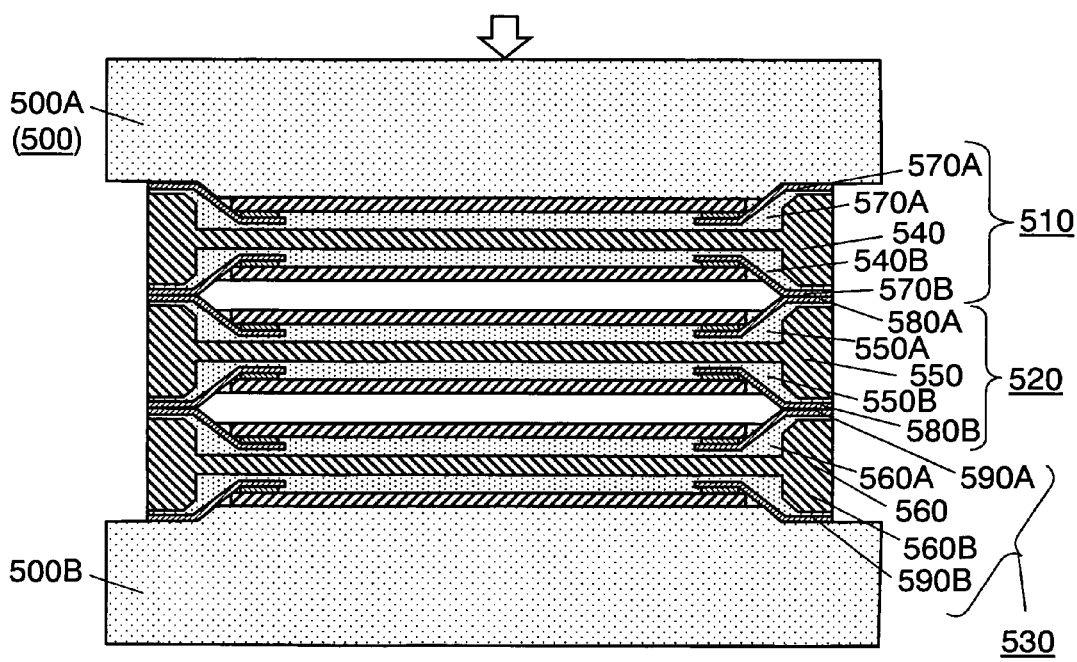
FIG. 11 is a cross sectional view of pressing in the method for manufacturing the multilayer 3D circuit module according to the second embodiment of the present invention.

As shown by the arrow of FIG. 10, top mold 500A is lowered in parallel with bottom mold 500B. At this moment, as shown in the cross sectional view of FIG. 11, a layer structure of 3D circuit modules 510, 520 and 530 is placed between top mold 500A and bottom mold 500B, and is pressed with a predetermined pressure (e.g., 3 kgf/cm$^2$ to 30 kgf/cm$^2$). The pressure depends on the pin number and size of electronic components. In this case, it is preferable to provide a mold release sheet or the like between the top mold of the press and the uppermost 3D circuit module and also between the bottom mold and the lowermost 3D circuit module so as to prevent adhesion between the press and the 3D circuit modules or to achieve uniform pressure distribution.

As a result of this pressing, coating layer 540B of 3D circuit module 510 and coating layer 550A of 3D circuit module 520 which are adjacent are bonded to each other and integrated. Also, coating layer 550B of 3D circuit module 520 and coating layer 560A of 3D circuit module 530 which are adjacent are bonded to each other and integrated. First land 570B on coating layer 540B and first land 580A on coating layer 550A are electrically connected with each other. Also, first land 580B on coating layer 550B and first land 590A on coating layer 560A are electrically connected with each other.

Figure 12:
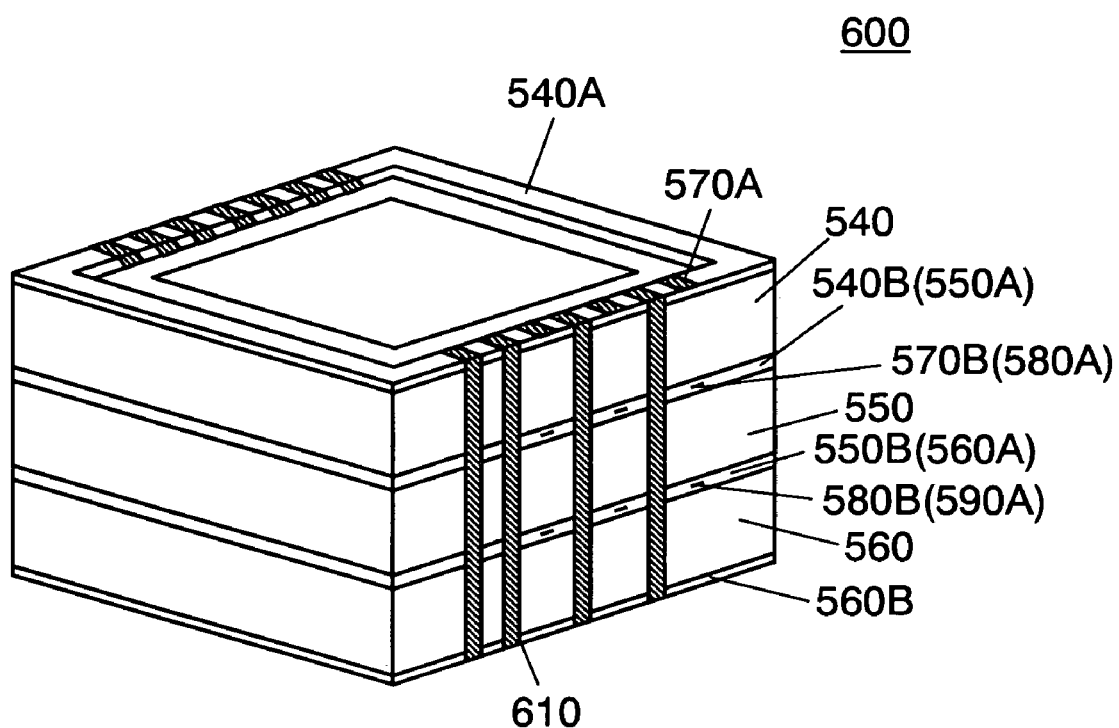
FIG. 12 is an external perspective view of the multilayer 3D circuit module according to the second embodiment of the present invention.
Figure 13A:
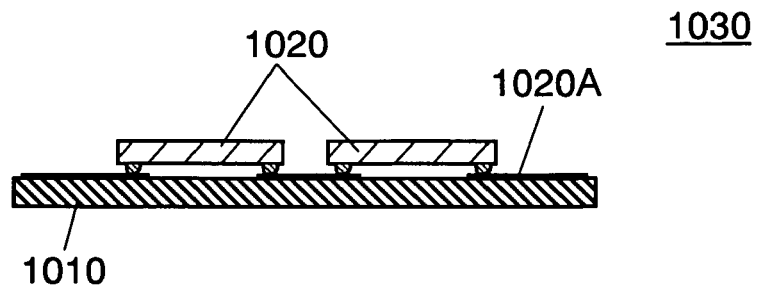
FIGS. 13A and 13B are cross sectional views of a conventional circuit module board.
Figure 13B:
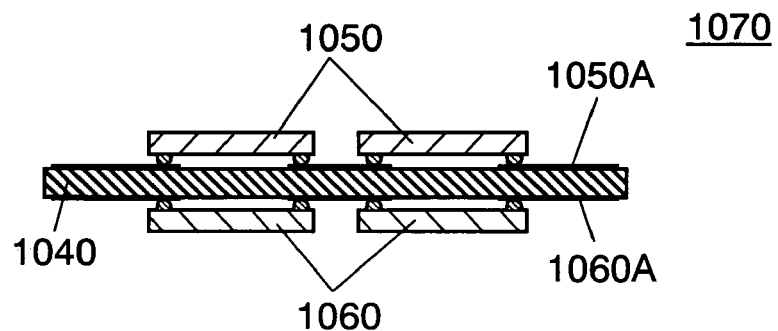
Figure 14:
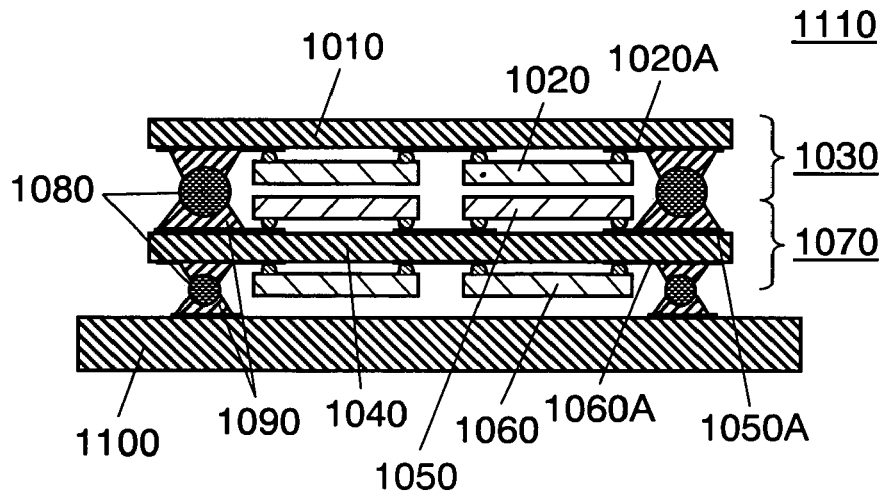
FIG. 14 is a cross sectional view of a circuit module board having a conventional multilayer 3D circuit.

Next, 3D circuit modules 510, 520 and 530 thus integrated is taken out of press 500 and cooled so as to obtain multilayer 3D circuit module 600 whose external perspective view is shown in FIG. 12. It goes without saying that in this process the multilayer 3D circuit module can be taken out of the press after being cooled.

During the cooling, the resin material composing coating layers 540B, 550A and coating layers 550B, 560A shrinks to further secure the connection between first lands 570B and 580A and between first lands 580B and 590A.

The layered 3D circuit modules are connected with each other by via holes (unillustrated) or interlayer connection electrodes 610 as shown in FIG. 12. Interlayer connection electrodes 610 are formed by etching the outer side surfaces of frames 540, 550 and 560 of the support members of the 3D circuit modules after screen printing or copper foil application.

Multilayer 3D circuit module 600 thus obtained can be used in electronic circuit devices such as memory cards or in mobile devices which are electrically connected with external electronic devices via the first lands.

The second embodiment of the present invention has described a method for manufacturing a multilayer 3D circuit module consisting of three layered 3D circuit modules; however, the present invention is not restricted to this example. A multilayer 3D circuit module having any number of layers can be obtained by applying this manufacturing method to the 3D circuit module shown in FIG. 3 or to the 3D circuit module mounted with a plurality of electronic components shown in FIGS. 4 and 5.

The second embodiment of the present invention enables the easy, efficient and stable manufacture of a multilayer 3D circuit module having 3D structure of wiring which is formed concurrently with the pressing of the electronic components, without using any special connection member.

In each of the aforementioned embodiments, it is possible to form a recess in the frame of the support member, a throughhole between the side surfaces of the frame, and a groove in the region of the frame where the first lands cannot be formed. Such throughhole or groove can remove parts of the coating layers or the coating sheets that are squeezed out by the electronic components when the resin material of the coating layers or the coating sheets cannot be absorbed by compression or contraction. This can prevent the coating layers and the coating sheets from deforming due to uneven pressure distribution or from causing foam residue.

The 3D circuit modules and the multilayer 3D circuit module in each of the aforementioned embodiments can be used in memory cards, IC cards, mobile devices, mobile terminals and the like to achieve mobile terminal devices with reduced size and weight and increased capacity.

What is claimed is:

1. A 3D circuit module comprising:
   a support member having a frame in a periphery thereof and a recess;
   a coating layer for coating the frame and filling in the recess, the coating layer being made of resin material which is adhesive and has a softening temperature lower than a softening temperature of the support member;

a wiring pattern formed on the coating layer and partly pressed thereinto, the wiring pattern having a first surface and a second surface opposite to the first surface, and including a first land over the frame, a second land within the recess, and a wiring part for connecting between the first land and the second land; and an electronic component having a first surface, a second surface opposite to the first surface, and side surfaces, accommodated in the recess and having a projecting electrode formed on the first surface of the electronic component, only the side surfaces and the first surface formed with the projecting electrode of the electronic component being bonded to the coating layer, wherein the projecting electrode is directly bonded to the first surface of the wiring pattern at the second land, the coating layer is disposed at least between the second surface of the wiring pattern and the support member, and the resin material encapsulates the electronic component and the wiring pattern and separates the second surface of the wiring pattern from surfaces of the recess.

2. The 3D circuit module according to claim 1, wherein the frame and the recess are formed on both sides of the support member in a thickness direction thereof.

3. The 3D circuit module according to claim 1, wherein the recess is divided into a plurality of sections by the frame and a partition frame of the support member.

4. The 3D circuit module according to claim 1, wherein the resin material is a thermoplastic resin having a lower softening temperature than the softening temperature of the support member.

5. A multilayer 3D circuit module comprising:

a plurality of 3D circuit modules according to claim 1 layered in such a manner that each of the coating layers that coats the frame of the support member of each of the plurality of 3D circuit modules is bonded to an adjacent one of the coating layers that coats the frame of the support member of an adjacent one of the plurality of 3D circuit modules so as to connect each of the first lands with an adjacent one of the first lands of the wiring patterns.

6. A mobile terminal device mounted with a 3D circuit module, the 3D circuit module comprising:

a support member having a frame in a periphery thereof and a recess;

a coating layer for coating the frame and filling in the recess, the coating layer being made of resin material which is adhesive and has a softening temperature lower than a softening temperature of the support member;

a wiring pattern formed on the coating layer and partly pressed thereinto, the wiring pattern having a first surface and a second surface opposite to the first surface, and including a first land over the frame, a second land within the recess, and a wiring part for connecting between the first land and the second land; and an electronic component having a first surface, a second surface opposite to the first surface, and side surfaces, accommodated in the recess and having a projecting electrode formed on the first surface of the electronic component, only the side surfaces and the first surface formed with the projecting electrode of the electronic component being bonded to the coating layer, wherein the projecting electrode is directly bonded to the first surface of the wiring pattern at the second land, the coating layer is disposed at least between the second surface of the wiring pattern and the support member, and the resin material encapsulates the electronic component and the wiring pattern and separates the second surface of the wiring pattern from surfaces of the recess.

7. The mobile terminal device according to claim 6 comprising:

a plurality of 3D circuit modules layered in such a manner that each of the coating layers that coats the frame of the support member of each of the plurality of 3D circuit modules is bonded to an adjacent one of the coating layers that coats the frame of the support member of an adjacent one of the plurality of 3D circuit modules so as to connect each of the first lands with an adjacent one of the first lands of the wiring patterns.

8. The 3D circuit module according to claim 1, wherein:

the recess has side portions and a bottom portion, and the coating layer is disposed at least between the first surface of the wiring pattern and the bottom portion of the recess of the support member.

9. The mobile terminal device according to claim 6, wherein:

the recess has side portions and a bottom portion, and the coating layer is disposed at least between the first surface of the wiring pattern and the bottom portion of the recess of the support member.

10. The 3D circuit module according to claim 1, wherein the coating layer is disposed between the second surface of the wiring pattern and the support member on the frame and within the recess.

11. The mobile terminal device according to claim 6, wherein the coating layer is disposed between the second surface of the wiring pattern and the support member on the frame and within the recess.

* * * * *